(12) United States Patent
Helm et al.

(10) Patent No.: US 6,635,530 B2
(45) Date of Patent: *Oct. 21, 2003

(54) METHODS OF FORMING GATED SEMICONDUCTOR ASSEMBLIES

(75) Inventors: Mark A. Helm, Boise, ID (US); Mark Fischer, Boise, ID (US); John T. Moore, Boise, ID (US); Scott Jeffrey DeBoer, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/057,148

(22) Filed: Apr. 7, 1998

(65) Prior Publication Data

US 2002/0001897 A1 Jan. 3, 2002

(51) Int. Cl.$^7$ ................ H01L 21/336; H01L 21/31; H01L 21/469
(52) U.S. Cl. ................ 438/257; 438/266; 438/268; 438/791
(58) Field of Search ................ 438/266, 257, 438/268, 291

(56) References Cited

U.S. PATENT DOCUMENTS

| 3,549,411 A | 12/1970 | Bean et al. |
| 3,649,884 A | * 3/1972 | HAneta ................ 317/235 |

(List continued on next page.)

FOREIGN PATENT DOCUMENTS

| GB | 2129217 A | 5/1984 |
| GB | 2145243 A | 3/1985 |
| GB | 2170649 | 8/1986 |
| JP | 36237854 | 6/1987 |
| JP | 401086562 | 3/1989 |
| JP | 403075158 | 3/1991 |

OTHER PUBLICATIONS

Chang, E. et al., "Passivation of GaAs FET's with PECVD Silicon Nitride Films of Different Stress States", IEEE Transactions on Electron Devices, vol. 3, No. 9 (Sep. 1988), pp. 1412–1418.
Kovac, Z. et al., "Silicon Nitride Overcoats for Thin Film Magnetic Recording Media", IEEE Transactions on Magnetics, vol. 27, No. 6, (Nov. 1991), pp. 5070–5072.
Wolf, S., "Silicon Processing for the VLSI Era", vol. 1: Process Technology, Lattice Press 1986, pp. 191–193.
Mayer, J. et al., "Electronic Materials Science: For Integrated Circuits in Si and GaAs", Macmillan Pub. Co. 1990, pp. 269–274.
Abstract: Kanicki, J. et al., "Intrinsic Stress in Silicon Nitride and Silicon Dioxide Films Prepared by Various Deposition Techniques", 1988 IEEE Internatl. Sympos. on Elect. Insulation, Boston, MA (Jun. 5–8, 1988), 1 page.

(List continued on next page.)

*Primary Examiner*—Long Pham
*Assistant Examiner*—Rao H Shrinivas
(74) *Attorney, Agent, or Firm*—Wells St. John P.S.

(57) ABSTRACT

The invention includes a method of forming a gated semiconductor assembly. A first transistor gate layer is formed over a substrate. A silicon nitride layer is formed over the first transistor gate layer. The silicon nitride layer comprises a first portion and a second portion elevationally displaced above the first portion. The first portion has less electrical resistance than the second portion and a different stoichiometric composition than the second portion. The first portion is physically against the second portion. A second transistor gate layer is formed over the silicon nitride layer.

20 Claims, 6 Drawing Sheets

U.S. PATENT DOCUMENTS

| | | | |
|---|---|---|---|
| 3,884,698 A | 5/1975 | Kakihama et al. | 117/217 |
| 4,075,367 A | 2/1978 | Gulett | |
| 4,330,569 A | 5/1982 | Gulett et al. | 427/38 |
| 4,439,270 A | 3/1984 | Powell et al. | |
| 4,446,194 A | 5/1984 | Candelaria et al. | |
| 4,485,553 A | 12/1984 | Christian et al. | |
| 4,499,656 A | 2/1985 | Fabian et al. | 29/576 |
| 4,543,707 A | 10/1985 | Ito et al. | |
| 4,612,629 A * | 9/1986 | Harari | 365/185 |
| 4,695,872 A | 9/1987 | Chatterjee | |
| 4,698,787 A * | 10/1987 | Mukherjee et al. | 365/185 |
| 4,732,858 A | 3/1988 | Brewer et al. | |
| 4,868,632 A * | 9/1989 | Hayashi et al. | 357/54 |
| 4,874,716 A | 10/1989 | Rao | |
| 4,939,559 A * | 7/1990 | DiMaria | 357/23.5 |
| 4,996,081 A | 2/1991 | Ellul et al. | 427/96 |
| 5,041,888 A * | 8/1991 | Possin et al. | 357/23 |
| 5,045,345 A | 9/1991 | Singer | 427/38 |
| 5,045,847 A | 9/1991 | Tarui et al. | 340/783 |
| 5,098,865 A | 3/1992 | Machado et al. | |
| 5,160,998 A | 11/1992 | Itoh et al. | |
| 5,178,016 A | 1/1993 | Dauenhauer et al. | |
| 5,219,788 A | 6/1993 | Abernathey et al. | 437/187 |
| 5,304,829 A * | 4/1994 | Mori et al. | 257/324 |
| 5,306,946 A | 4/1994 | Yamamoto | |
| 5,442,223 A | 8/1995 | Fujii | |
| 5,489,542 A | 2/1996 | Iwai et al. | 437/41 |
| 5,518,946 A | 5/1996 | Kuroda | 437/52 |
| 5,523,616 A | 6/1996 | Den | |
| 5,554,418 A | 9/1996 | Ito et al. | 427/579 |
| 5,587,344 A | 12/1996 | Ishikawa | |
| 5,756,404 A | 5/1998 | Friedenreich et al. | |
| 5,773,325 A | 6/1998 | Teramoto | |
| 5,795,821 A | 8/1998 | Bacchetta et al. | |
| 5,831,321 A | 11/1998 | Nagayama | |
| 5,834,374 A | 11/1998 | Cabral, Jr. et al. | |
| 5,877,069 A | 3/1999 | Robinson | |
| 5,882,978 A | 3/1999 | Srinivasan et al. | |
| 5,891,793 A | 4/1999 | Gardner et al. | |
| 5,904,523 A | 5/1999 | Feldman et al. | |
| 5,918,147 A | 6/1999 | Filipiak et al. | |
| 5,925,494 A * | 7/1999 | Horn | 430/270.1 |
| 5,926,739 A | 7/1999 | Rolfson et al. | 438/763 |
| 5,985,771 A | 11/1999 | Moore et al. | |
| 6,093,956 A | 7/2000 | Moore et al. | |
| 6,103,619 A | 8/2000 | Lai | |
| 6,140,181 A | 10/2000 | Forbes et al. | |
| 6,143,627 A | 11/2000 | Robinson | |
| 6,265,241 B1 | 7/2001 | Pan | |
| 6,300,253 B1 | 10/2001 | Moore et al. | |
| 6,417,559 B1 | 7/2002 | Moore et al. | |

OTHER PUBLICATIONS

Wolf, S., "Silicon Processing for the VLSI Era", vol. 1, pp. 177–178.

Wolf, S., "Silicon Processing for the VLSI Era", vol. 2, pp. 37–38, 598–599.

U.S. patent application Ser. No. 09/031,251, Lam et al., filed Feb. 26, 1998.

U.S. patent application Ser. No. 09/057,155, Moore et al., Apr. 7, 1998.

U.S. patent application Ser. No. 09/057,148, Moore.

\* cited by examiner

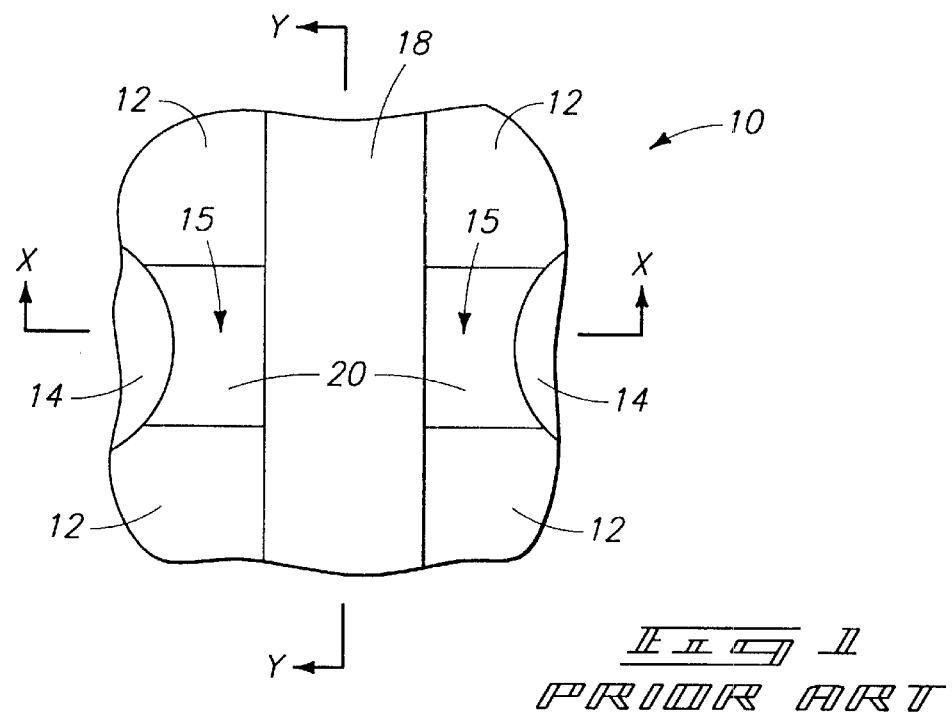
_Fig. 1_
PRIOR ART
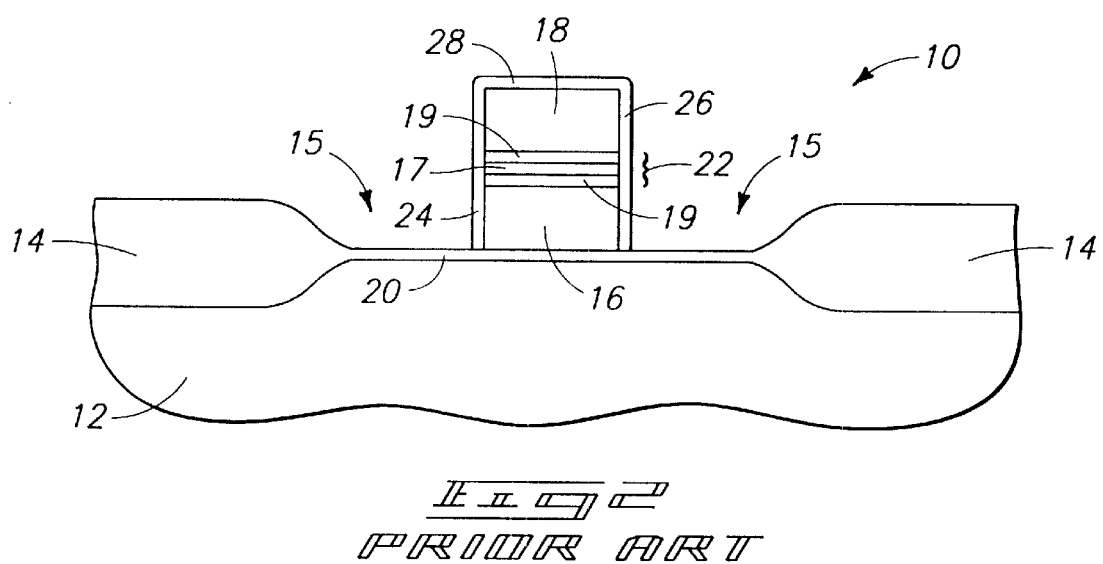
_Fig. 2_
PRIOR ART

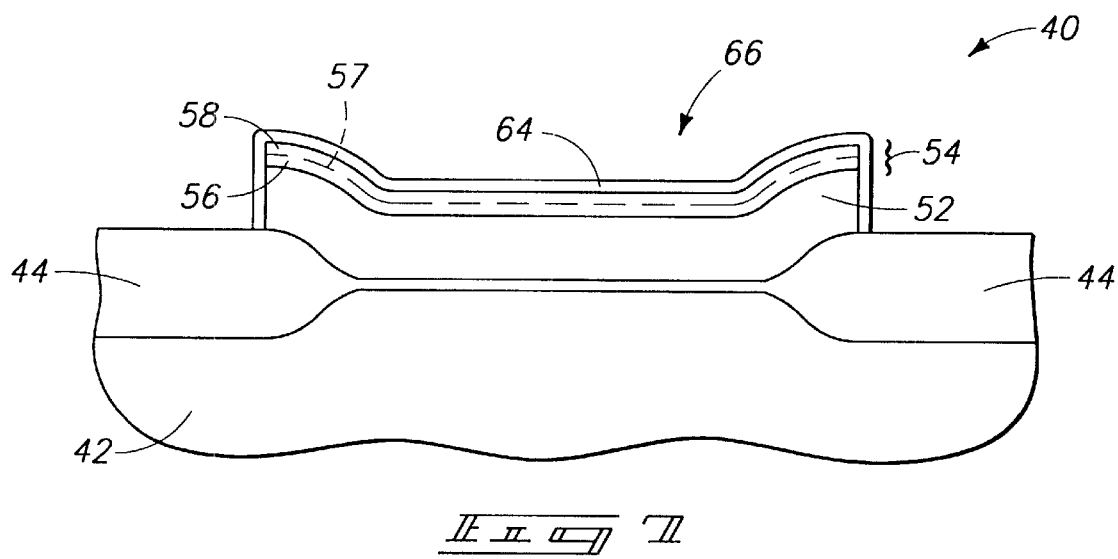
_Fig. 7_
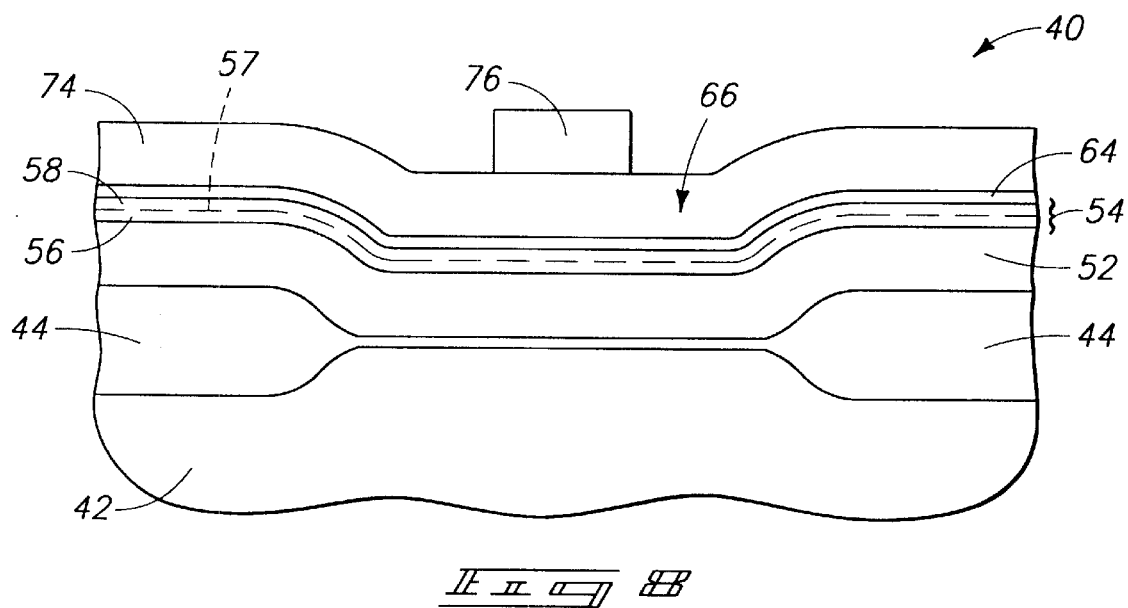
_Fig. 8_

METHODS OF FORMING GATED SEMICONDUCTOR ASSEMBLIES

TECHNICAL FIELD

The invention pertains to gated semiconductor assemblies, such as, for example, erasable, programmable read-only memories (EPROMS), electrically erasable proms (EEPROMS), and flash EEPROMS.

BACKGROUND OF THE INVENTION

Read-only-memories (ROMs) are memories into which information is permanently stored during fabrication. Such memories are considered "non-volatile" as only read operations can be performed.

Each bit of information in a ROM is stored by the presence or absence of a data path from the word (access) line to a bit (sense) line. The data path is eliminated simply by insuring no circuit element joins a word and bit line. Thus, when the word line of a ROM is activated, the presence of a signal on the bit line will mean that a 1 is stored, whereas the absence of a signal indicates that a 0 is stored.

If only a small number of ROM circuits are needed for a specific application, custom mask fabrication might be too expensive or time consuming. In such cases, it would be faster and cheaper for users to program each ROM chip individually. ROMs with such capabilities are referred to as programmable read-only-memories (PROMs). In the first PROMs which were developed, information could only be programmed once into the construction and then could not be erased. In such PROMs, a data path exists between every word and bit line at the completion of the chip manufacture. This corresponds to a stored 1 in every data position. Storage cells during fabrication were selectively altered to store a 0 following manufacture by electrically severing the word-to-bit connection paths. Since the write operation was destructive, once the 0 had been programmed into a bit location it could not be erased back to a 1. PROMs were initially implemented in bipolar technology, although MOS PROMs became available.

Later work with PROMs led to development of erasable PROMs. Erasable PROMs depend on the long-term retention of electric charge as the means for information storage. Such charge is stored on a MOS device referred to as a floating polysilicon gate. Such a construction differs slightly from a conventional MOS transistor gate. The conventional MOS transistor gate of a memory cell employs a continuous polysilicon word line connected among several MOS transistors which functions as the respective transistor gates. The floating polysilicon gate of an erasable PROM interposes a localized secondary polysilicon gate in between the continuous word line and silicon substrate into which the active areas of the MOS transistors are formed. The floating gate is localized in that the floating gates for respective MOS transistors are electrically isolated from the floating gates of other MOS transistors.

Various mechanisms have been implemented to transfer and remove charge from a floating gate. One type of erasable programmable memory is the so-called electrically programmable ROM (EPROM). The charge-transfer mechanism occurs by the injection of electrons into the floating polysilicon gate of selected transistors. If a sufficiently high reverse-bias voltage is applied to the transistor drain being programmed, the drain-substrate "pn" junction will experience "avalanche" breakdown, causing hot electrons to be generated. Some of these will have enough energy to pass over the insulating oxide material surrounding each floating gate and thereby charge the floating gate. These EPROM devices are thus called floating-gate, avalanche-injection MOS transistors (FAMOS). Once these electrons are transferred to the floating gate, they are trapped there. The potential-barrier at the oxide-silicon interface of the gate is greater than 3 eV, making the rate of spontaneous emission of the electrons from the oxide over the barrier negligibly small. Accordingly, the electronic charge stored on the floating gate can be retained for many years.

When the floating gate is charged with a sufficient number of electrons, channel function is inhibited. The presence of a 1 or 0 in each bit location is therefore determined by the presence or absence of a conducting floating channel gate in each program device.

Such a construction also enables means for removing the stored electrons from the floating gate, thereby making the PROM erasable. This is accomplished by flood exposure of the EPROM with strong ultraviolet light for approximately 20 minutes. The ultraviolet light creates electron-hole pairs in the silicon dioxide, providing a discharge path for the charge (electrons) from the floating gates.

In some applications, it is desirable to erase the contents of a ROM electrically, rather than to use an ultraviolet light source. In other circumstances, it would be desirable to be able to change one bit at a time, without having to erase the entire integrated circuit. Such led to the development of electrically erasable PROMs (EEPROMs). Such technologies include MNOS transistors, floating-gate tunnel oxide MOS transistors (FLOTOX), textured high-polysilicon floating-gate MOS transistors, and flash EEPROMs. Such technologies can include a combination of floating gate transistor memory cells within an array of such cells, and a peripheral area to the array which comprises CMOS transistors.

A prior art EPROM device is described with reference to semiconductor wafer fragment 10 of FIGS. 1–3. FIG. 1 is a top view of wafer fragment 10, and FIGS. 2 and 3 are cross-sectional side views along the lines labelled X—X and Y—Y, respectively, in FIG. 1. Wafer fragment 10 comprises a substrate 12, having field oxide regions 14 formed thereover. Substrate 12 can comprise, for example, lightly doped monocrystalline silicon. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Field oxide regions 14 can comprise, for example, silicon dioxide. An active region 15 extends over and within substrate 12 between field oxide regions 14. A floating gate 16 and a control gate 18 are formed over the active region. Gates 16 and 18 can comprise, for example, conductively doped polysilicon.

Floating gate 16 is separated from substrate 12 by a tunnel oxide layer 20. Gates 16 and 18 are separated from one another by an insulative layer 22 which can comprise, for example, a combination of silicon dioxide and silicon nitride, such as the shown ONO construction wherein a silicon nitride layer 17 is sandwiched between a pair of silicon dioxide layers 19. The silicon nitride comprises $Si_3N_4$, although other forms of silicon nitride are known. Such other forms include silicon enriched silicon nitride layers (i.e., silicon nitride layers having a greater concentration of silicon than $Si_3N_4$, such as, for example, $Si_4N_4$). An advantage of silicon-enriched silicon nitride layers relative to $Si_3N_4$ is that the silicon-enriched silicon nitride layers frequently do not require separate, discrete antireflective coatings formed between them and a photoresist. However, silicon enriched silicon nitride is difficult to pattern due to a resistance of the material to etching. Silicon enriched silicon nitride layers are formed to have a substantially homogenous composition throughout their thicknesses, although occasionally a small portion of a layer (1% or less of a thickness of the layer) is less enriched with silicon than the remainder of the layer due to inherent deposition problems.

Wafer fragment 10 further comprises silicon dioxide layers 24 and 26 extending along sidewalls of gates 16 and 18, and comprises a silicon dioxide layer 28 over control gate 18. Layers 24, 26 and 28 can electrically insulate gates 16 and 18 from other circuitry (not shown) that may be present on substrate 12.

The gate assembly shown in FIGS. 1–3 can be formed as follows. Initially, a portion of substrate 12 within the active region is oxidized to form an oxide layer which will ultimately be patterned into tunnel oxide 20. Next, a polysilicon layer is formed over the silicon dioxide layer, with the polysilicon layer ultimately being patterned to form floating gate 16. An antireflective coating is formed over the polysilicon layer, and a layer of photoresist formed over the antireflective coating.

After the photoresist is formed, it is patterned by selectively exposing portions of the photoresist to light to render the portions either more soluble or less soluble in a solvent than portions which are not exposed to the light. The antireflective coating absorbs light that penetrates the photoresist to prevent such light from reflecting back to either constructively or destructively interfere with other light passing through the photoresist. The photoresist is then exposed to the solvent to remove the more soluble portions of the photoresist and leave a patterned photoresist block over a portion of the polysilicon layer that is to become floating gate 16.

The patterned photoresist block protects the portion of the polysilicon layer it covers, while uncovered portions of the antireflective coating, polysilicon layer, and silicon oxide layers are removed with an etch. The portions of the polysilicon layer and oxide layer which remain are in the shape of floating gate 16 and tunnel oxide 20.

After the etch of the antireflective coating, polysilicon and oxide, the photoresist and antireflective coating are removed from over floating gate 16. The polysilicon of floating gate 16 is then exposed to oxygen under conditions which form a silicon dioxide layer over exposed surfaces of the polysilicon to create oxidized sidewalls 24 and 26, and a portion of insulative layer 22. Subsequently, layers of silicon nitride and silicon dioxide are provided to complete formation of insulative layer 22. Next, a second polysilicon layer is provided and patterned to form control gate 18. The second polysilicon layer is then exposed to oxygen to form silicon dioxide layers 24 and 26 at the sidewalls of control gate 18, and to form silicon dioxide layer 28 over a top of control gate 18.

Source and drain regions can be provided within active area 15 and operatively adjacent floating gate 16. The source and drain regions can be provided by implanting a conductivity enhancing dopant into substrate 12 after forming floating gate 16 and before oxidizing sidewalls of floating gate 16.

A continuing goal in semiconductor device fabrication is to minimize the number of fabrication steps required to form a semiconductor device. Accordingly, it would be desired to eliminate one or more of the above-discussed steps in forming a gated semiconductor assembly.

SUMMARY OF THE INVENTION

In one aspect, the invention encompasses a method of forming a gated semiconductor assembly. A silicon nitride layer is formed over and against a floating gate. A control gate is formed over the silicon nitride layer.

In another aspect, the invention encompasses a method of forming a semiconductor assembly. A first material layer is formed over a substrate. A silicon nitride layer is formed over the first material layer. The silicon nitride layer comprises a first portion and a second portion elevationally displaced from the first portion. The first portion has a greater stoichiometric amount of silicon than the second portion. A photoresist layer is formed over the first material layer and the silicon nitride layer. The photoresist layer is patterned. The patterning comprises exposing portions of the layer of photoresist to light and utilizing the silicon nitride layer as an antireflective surface during the exposing. The pattern is transferred from the patterned photoresist to the silicon nitride layer and the first material layer.

In yet another aspect, the invention encompasses a gated semiconductor assembly comprising a substrate, a floating gate over the substrate, a control gate over the floating gate, and an electron barrier layer between the floating gate and the control gate. The electron barrier layer comprises a silicon nitride layer. The silicon nitride layer comprises a first portion and a second portion elevationally displaced from the first portion. The first portion has a greater stoichiometric amount of silicon than the second portion.

BRIEF DESCRIPTION OF THE DRAWINGS

Preferred embodiments of the invention are described below with reference to the following accompanying drawings.

FIG. 1 is a fragmentary, diagrammatic top view of a prior art gated semiconductor assembly FIG. 2 is a diagrammatic, fragmentary, cross-sectional view of the FIG. 1 gated semiconductor assembly along the line X—X of FIG. 1.

FIG. 7 is a view of the FIG. 6 wafer fragment shown along an axis corresponding to line Y—Y of FIG. 1.

FIG. 8 is a view of the FIG. 4 wafer fragment shown at a processing step subsequent to that of FIG. 6, and shown along an axis corresponding to line X—X of FIG. 1.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

A method of forming a gated semiconductor assembly in accordance with the present invention is described with reference to FIGS. 4–11. FIGS. 4, 6, 8 and 10 are views of a semiconductor wafer fragment shown at sequential steps of a fabrication process, and shown along an axis corresponding to line X—X of FIG. 1. FIGS. 5, 7, 9 and 11 are views of the processed wafer fragments of FIGS. 4, 6, 8 and 10, respectively, along an axis corresponding to line Y—Y of FIG. 1.

Figure 3:
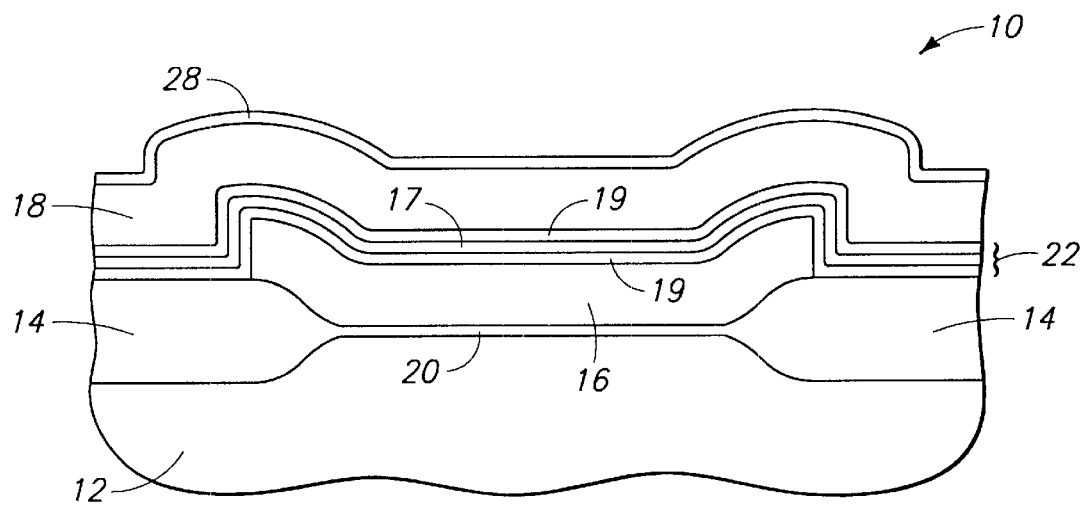
FIG. 3 is a diagrammatic, fragmentary, cross-sectional view of the FIG. 1 gated semiconductor assembly along the line Y—Y of FIG. 1.
Figure 4:
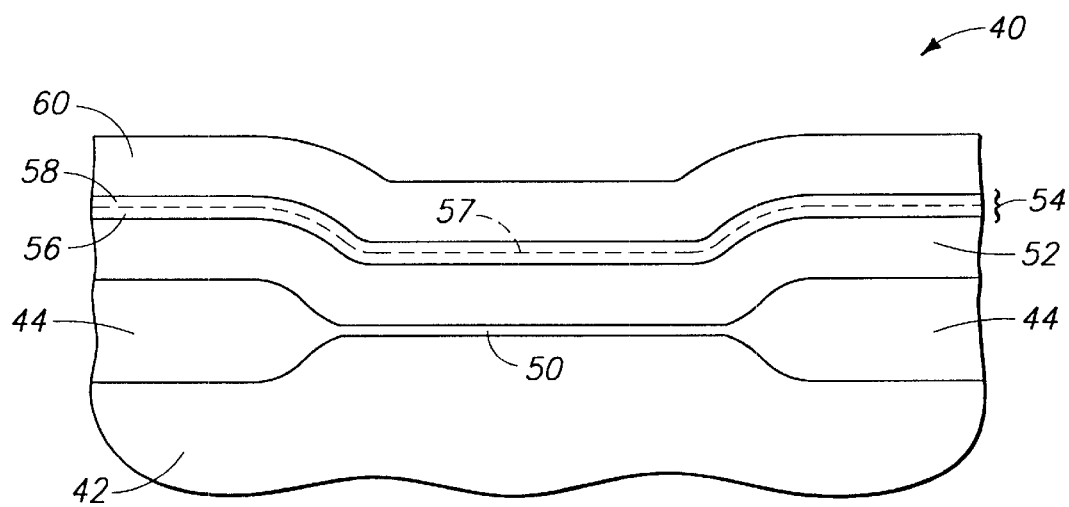
FIG. 4 is a diagrammatic, fragmentary, cross-sectional view of a semiconductor wafer fragment at a preliminary processing step of a method of the present invention, shown along an axis corresponding to line X—X of FIG. 1.
Figure 5:
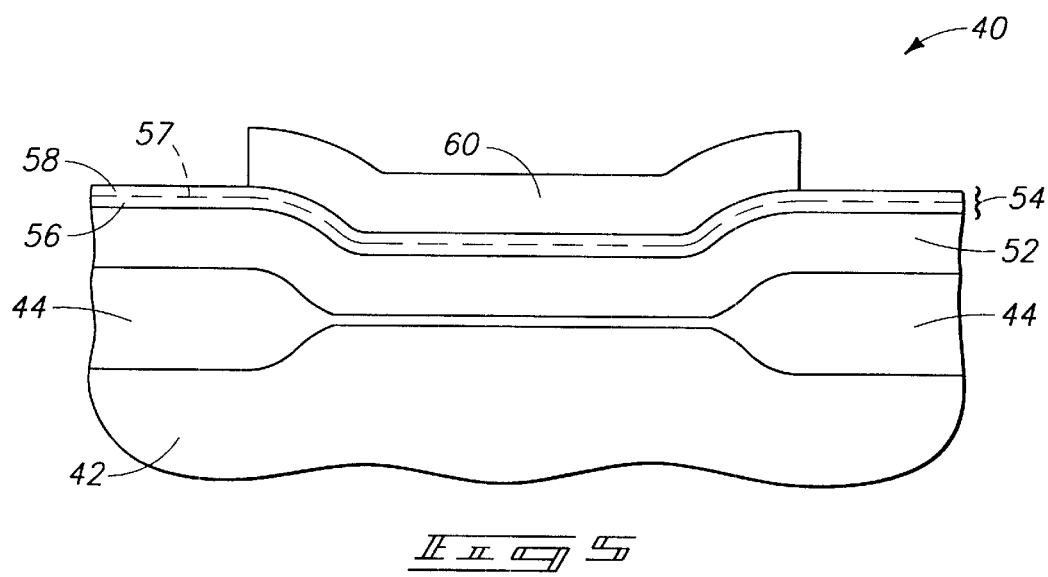
FIG. 5 is a view of the FIG. 4 wafer fragment shown along an axis corresponding to line Y—Y of FIG. 1.

Referring to FIGS. 4 and 5, a semiconductor wafer fragment 40 comprises a substrate 42, and field oxide regions 44 formed over substrate 42. Substrate 42 and field oxide regions 44 can comprise the same compositions as substrate 12 and field oxide regions 14 discussed above in the "background" section. A portion of substrate 42 between field oxide regions 44 is defined as an active region.

A first silicon dioxide layer 50 is formed over the active region. Silicon dioxide layer 50 can be formed by, for example, exposing a silicon-comprising substrate 42 to oxygen at temperatures of, for example, at least 800° C.

A silicon-comprising floating gate layer 52 is formed over field oxide regions 44 and first silicon dioxide layer 50. Floating gate layer 52 can comprise, for example, amorphous silicon or polycrystalline silicon, and can be formed by, for example, chemical vapor deposition. The silicon of layer 52 is preferably doped with a conductivity-enhancing dopant to a concentration of greater than or equal to $1 \times 10^{19}$ atoms/cm$^3$. The dopant can be, for example, provided in situ during the chemical vapor deposition process, or provided by implanting it into layer 52.

A silicon nitride layer 54 is formed over floating gate layer 52. In the shown preferred embodiment, silicon nitride layer 54 comprises a first portion 56 and a second portion 58, with one of portions 56 and 58 having a higher stoichiometric amount of silicon than the other of portions 56 and 58. Preferably, upper portion 58 will have a greater stoichiometric amount of silicon than will lower portion 56 in addition, portion 56 will have less electrical resistance than portion 58. An interface between portions 56 and 58 is illustrated with dashed line 57. In the shown embodiment, silicon nitride layer 54 is formed against floating gate layer 52. In other embodiments (not shown) an intervening silicon oxide layer can be formed between silicon nitride layer 54 and floating gate layer 52. Such intervening oxide layer can be formed by, for example, chemical vapor deposition or growth from the silicon of floating gate layer 52.

A preferred method of forming silicon nitride layer 54 is a chemical vapor deposition process. A silicon precursor gas and a nitrogen precursor gas are flowed into a reaction chamber at a first ratio to form portion 56 of silicon nitride layer 54, and then the ratio is changed to form portion 58. The silicon precursor gas can comprise, for example, SiH$_2$Cl$_2$ (dichlorosilane), and the nitrogen precursor gas can comprise, for example, NH$_3$ (ammonia). Example conditions for depositing silicon nitride from NH$_3$ and SiH$_2$Cl$_2$ comprise temperatures of from about 700° C. to about 800° C., and pressures of from about 100 mTorr to about 1 Torr.

In a process wherein upper portion 58 is to have a greater stoichiometric amount of silicon than lower portion 56, the initial ratio of SiH$_2$Cl$_2$ to NH$_3$ flowed into a chemical vapor deposition can be, for example, about 0.33. Such ratio is flowed into the reaction chamber until first portion 56 is formed to a thickness of from about 50 Angstroms to about 500 Angstroms, and preferably to a thickness of about 75 Angstroms. The ratio of SiH$_2$Cl$_2$ to NH$_3$ of about 0.33 forms a first portion 56 having a stoichiometry of about Si$_3$N$_4$.

After forming first portion 56, the ratio of SiH$_2$Cl$_2$ to NH$_3$ is adjusted to be greater than 0.33 (such as, for example, about 6) to form upper portion 58. Upper portion 58 is preferably formed to a thickness of from about 50 Angstroms to about 500 Angstroms, preferably to a thickness of less than or equal to about 200 Angstroms, and more preferably to a thickness of less than or equal to about 100 Angstroms. Upper portion 58 preferably comprises a stoichiometry of Si$_x$N$_y$, wherein a ratio of x to y is at least 1. For example, upper portion 58 can comprise one or more of Si$_4$N$_4$, Si$_7$N$_4$ and Si$_{10}$N$_1$. If the ratio of SiH$_2$Cl$_2$ to NH$_3$ is about 6, upper portion 58 will have a stoichiometry of about Si$_4$N$_4$.

Preferably, portions 56 and 58 are formed in a common and uninterrupted deposition process. By "common deposition process" it is meant a deposition process wherein a wafer is not removed from a reaction chamber between the time that an initial portion of a silicon nitride layer is formed and the time that a final portion of the silicon nitride layer is formed. By "uninterrupted deposition process" it is meant a process wherein the flow of at least one of the silicon precursor gas and the nitrogen precursor gas does not stop during the deposition process.

In a most preferred embodiment of the invention, floating gate layer 52 and silicon nitride layer 54 will be formed in a common and uninterrupted deposition process. Such uninterrupted deposition process can comprise, for example, flowing SiH$_2$Cl$_2$ into a chemical reaction chamber, without NH$_3$ being flowed into the chamber, to deposit a silicon-comprising floating gate layer 52 over substrate 42. Floating gate layer 52 is preferably formed to a thickness of from about 200 Angstroms to about 2000 Angstroms. After formation of floating gate layer 52, the SiH$_2$Cl$_2$ flow is maintained (although it may be reduced or increased) and a flow of NH$_3$ is initiated in the chamber to form first portion 56 of silicon nitride layer 54. The ratio of SiH$_2$Cl$_2$ to NH$_3$ flowing within the reaction chamber is then altered to form second portion 58 of silicon nitride layer 54.

After formation of silicon nitride layer 54, a patterned photoresist layer 60 is formed over silicon nitride layer 54. Patterned photoresist 60 is formed as follows. A photoresist material is provided over silicon nitride layer 54. The photoresist material is then exposed to a patterned beam of light to render portions of the material other than those of patterned layer 60 more soluble in a solvent than is the material of patterned layer 60. The solvent is then utilized to remove the more soluble portions and leave patterned layer 60.

Silicon nitride layer 54 can be utilized as an antireflective layer during exposure of the photoresist material to light. Specifically, it is observed that a refractive index of a silicon nitride layer increases as a stoichiometric amount of silicon increases within the layer. For instance, it is observed that Si$_4$N$_4$ has a reactive index of 2.2, Si$_7$N$_4$ has a refractive index of 2.5, Si$_{10}$N$_1$ has a refractive index of 3.0, and Si$_3$N$_4$ has a refractive index of only 2.0. A material is typically considered a suitable antireflective coating material if it has a refractive index of at least 2.2. Accordingly, the portions of silicon nitride layer 54 having a stoichiometry of $Si_xN_y$, where an x is at least equal to y, can be suitable antireflective materials.

Figure 6:
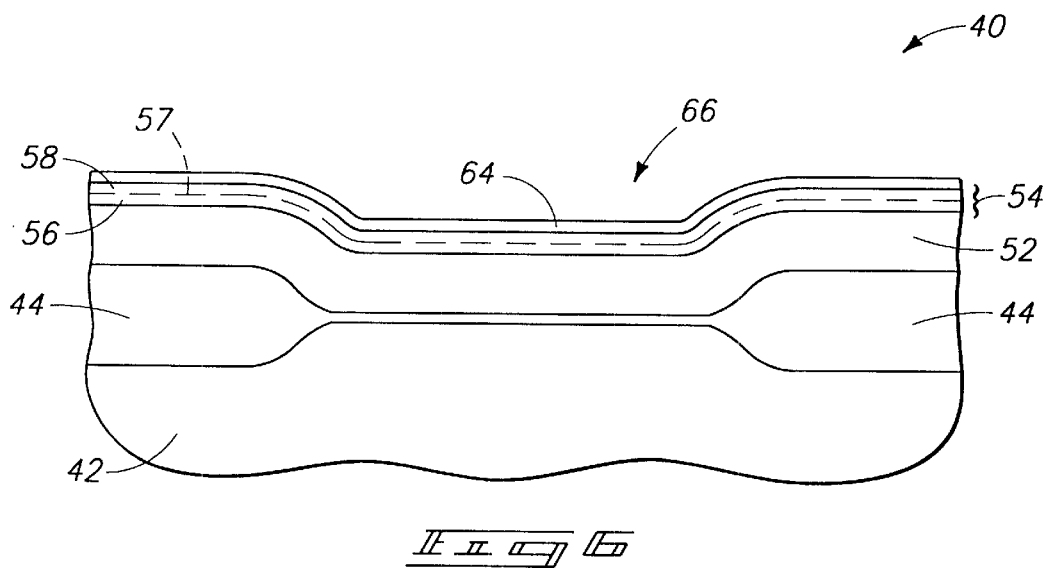
FIG. 6 is a view of the FIG. 4 wafer fragment shown at a processing step subsequent to that of FIG. 4, and shown along an axis corresponding to line X—X of FIG. 1.

Referring to FIGS. 6 and 7, a pattern from patterned photoresist layer 60 (FIGS. 4 and 5) is transferred to layers 54 and 52 to pattern layers 54 and 56 into a floating gate stack 66. The pattern of photoresist layer 60 can be transferred to layers 52 and 54 by etching portions of layers 52 and 54 which are not covered by photoresist layer 60. A suitable etch can comprise, for example, a plasma-enhanced etch utilizing $NF_3$ and HBr.

Photoresist layer 60 (FIGS. 4 and 5) is removed from over silicon nitride layer 54. Subsequently, a layer of silicon dioxide 64 is grown over gate stack 66. Silicon dioxide layer 64 is formed along a sidewall and over a top surface of gate stack 66. Silicon dioxide layer 64 can be formed by, for example, growth from silicon of layers 52 and 54, or by chemical vapor deposition. Growth of silicon dioxide layer 64 can be accomplished by exposing gate stack 66 to an atmosphere comprising oxygen atoms at a temperature of at least about 500° C.

Figure 9:
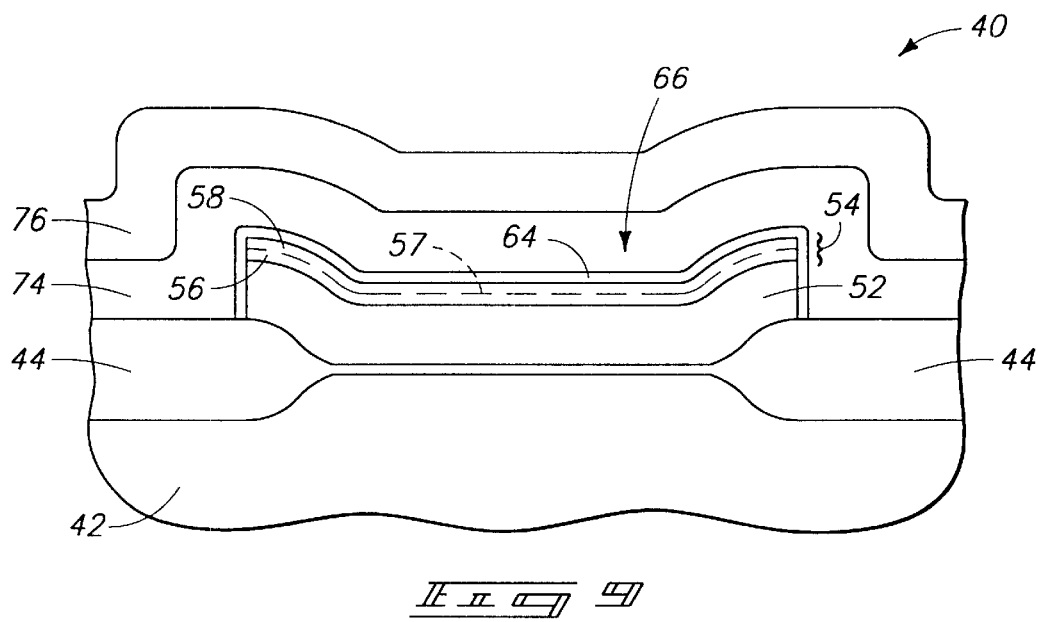
FIG. 9 is a view of the FIG. 8 wafer fragment shown along an axis corresponding to line Y—Y of FIG. 1.

Referring to FIGS. 8 and 9, a control gate layer 74 is formed over gate stack 66 and substrate 42, and a patterned photoresist mask 76 is formed over control gate layer 74. Control gate layer 74 can comprise, for example, conductively doped amorphous silicon or polycrystalline silicon, and can be formed by, for example, chemical vapor deposition.

Figure 10:
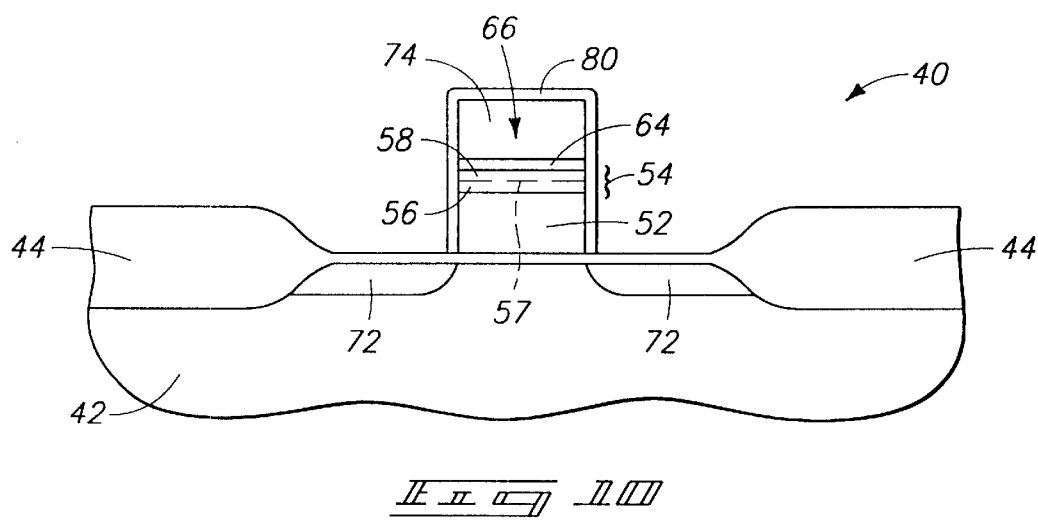
FIG. 10 is a view of the FIG. 4 wafer fragment shown at a processing step subsequent to that of FIG. 8, and shown along an axis corresponding to line X—X of FIG. 1.
Figure 11:
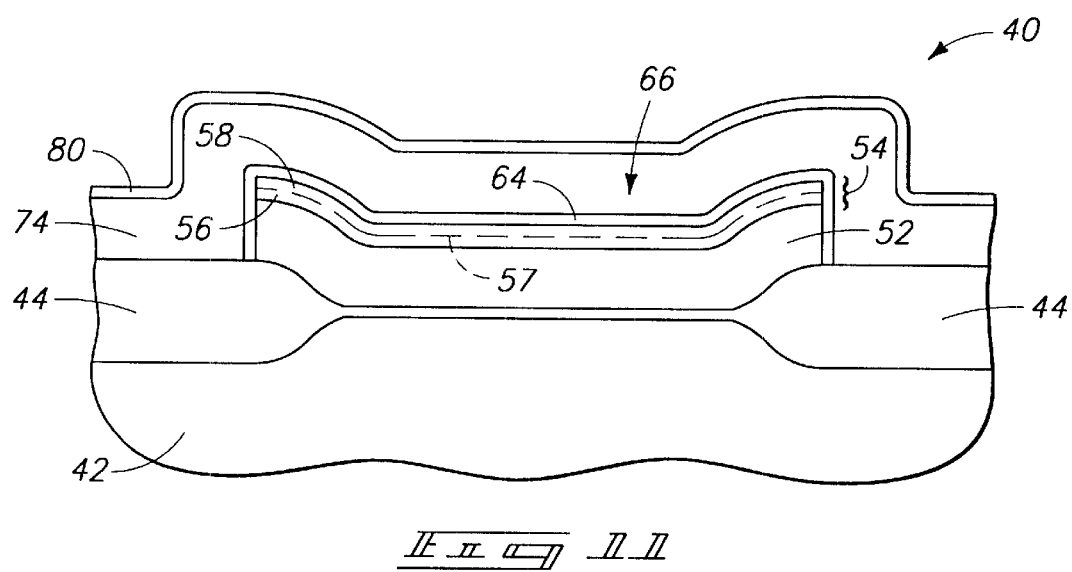
FIG. 11 is a view of the FIG. 10 wafer fragment shown along an axis corresponding to line Y—Y of FIG. 1.

Referring to FIGS. 10 and 11, a pattern is transferred from mask 76 (FIGS. 8 and 9) to control gate layer 74 to form layer 74 into a control gate over gate stack 66. The pattern can be transferred, with, for example, a plasma-enhanced etch utilizing $NF_3$ and HBr.

After formation of the control gate, an oxide layer 80 is formed over exposed surfaces of layers 52, 54 and 74. Oxide layer 80 can be formed by, for example, growth from the silicon of the control gate, or chemical vapor deposition.

Source and drain diffusion regions 72 are formed adjacent gate stack 66. Source and drain diffusion regions 72 can be formed by, for example, implanting a conductivity-enhancing dopant into substrate 42.

If one or both of floating gate layer 52 and control gate layer 74 comprise amorphous silicon, such layers are preferably converted to polycrystalline silicon in the gated semiconductor assembly of FIGS. 10 and 11. Such conversion can occur by, for example, thermal processing of the layers at a temperature of at least about 700° C., and preferably from about 700° C. to about 1100° C.

An advantage of the method of the present invention relative to prior art gated semiconductor assembly fabrication processes is that the method of the present invention can utilize an insulative material layer (54) as an antireflective surface during photolithographic processing of the insulative layer. Accordingly, the method of the present invention can eliminate a prior art utilization of a separate antireflective coating layer during patterning of an insulative layer over a floating gate construction. Another advantage of the method of the present invention is that it enables a common and uninterrupted deposition process to be utilized for formation of both a floating gate layer and an insulative layer over the floating gate layer.

As discussed above, it can be advantageous to have silicon nitride layer 54 comprise a portion having a stoichiometry of $Si_xN_y$, wherein x is greater than or equal to y, as such portion can be utilized as an antireflective layer. It is noted that it can also be advantageous to have silicon nitride layer 54 comprise a portion with a stoichiometry of $Si_xN_y$, wherein x is less than y, because such portion can be easier to etch than a portion having a greater stoichiometric amount of silicon. Accordingly, by having both types of portions between silicon nitride layer 54, the layer can be utilized as an antireflective material, and yet can be relatively easily removed when patterned.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a gated semiconductor assembly, comprising:

forming a first transistor gate layer over a substrate;

forming a silicon nitride layer over the first transistor gate layer; the forming the silicon nitride layer comprising forming a lower portion of the silicon nitride layer and subsequently forming an upper portion over the lower portion, the upper portion having a higher stoichiometric ratio of silicon to nitrogen than the lower portion, the lower portion contacting the upper portion, the upper portion comprising an atomic ratio of silicon to nitrogen of at least 1.75; the lower portion and upper portion being formed by flowing $SiH_2Cl_2$ and $NH_3$ into a reaction chamber, with the ratio of the $SiH_2Cl_2$ to the $NH_3$ being about 0.33 during the formation of the lower portion, and being greater than 6 during the formation of the upper portion; and forming a second transistor gate layer over the silicon nitride layer.

2. The method of claim 1 further comprising patterning the first gate layer, the silicon nitride layer and the second gate layer into a gate stack comprising a floating gate and a control gate.

3. The method of claim 1 further comprising forming a silicon dioxide layer over the upper portion, and wherein the second transistor gate layer is formed over the silicon dioxide layer.

4. The method of claim 3 wherein the forming the silicon dioxide layer comprises growing the silicon dioxide from silicon of the upper portion of the silicon nitride layer.

5. The method of claim 1 wherein the silicon nitride layer comprises at least one sidewall, the method further comprising forming a silicon dioxide layer over the upper portion and along the at least one sidewall of the silicon nitride layer, and wherein the second transistor gate is formed over the silicon dioxide layer.

6. The method of claim 5 wherein the forming the silicon dioxide layer comprises growing silicon dioxide from silicon of the upper portion of the silicon nitride layer.

7. A method of forming a gated semiconductor assembly, comprising:

forming a floating gate layer over a monocrystalline silicon substrate;

forming a silicon nitride layer over the floating gate layer, the silicon nitride layer comprising a first portion and a second portion elevationally displaced above the first portion, the first portion contacting the floating gate and having a lower stoichiometric amount of silicon than the second portion, the second portion contacting the first portion, the second portion comprising an atomic ratio of silicon to nitrogen of at least 1.75; the first portion and second portion being formed by flowing $SiH_2Cl_2$ and $NH_3$ into a reaction chamber, with the ratio of the $SiH_2Cl_2$ to the $NH_3$ being about 0.33 during the formation of the first portion, and being greater than 6 during the formation of the second portion; and forming a control gate over the silicon nitride layer.

8. The method of claim 7 further comprising:

forming a silicon dioxide layer over the substrate; and forming the floating gate layer over the silicon dioxide layer.

9. The method of claim 7 further comprising patterning the floating gate layer into a floating gate stack after forming the silicon nitride layer.

10. The method of claim 7 wherein the floating gate layer comprises at least one of amorphous silicon and polycrystalline silicon, and wherein the forming the floating gate layer and the forming the silicon nitride layer occur in a common and uninterrupted chemical vapor deposition process.

11. The method of claim 7 further comprising:

forming a silicon dioxide layer over the substrate;

forming the floating gate layer over the silicon dioxide layer, the floating gate layer comprising at least one of amorphous silicon and polycrystalline silicon;

after forming the first and second portions of the silicon nitride layer, forming a patterned photoresist layer over and against the second portion of the silicon nitride layer;

transferring a pattern from the patterned photoresist layer to the floating gate layer and the first and second portions of the silicon nitride layer to form a stack comprising the patterned floating gate layer and the patterned first and second portions of the silicon nitride layer, the stack having at least one sidewall;

growing a silicon dioxide layer over the second portion and along the at least one sidewall of the stack: and forming the control gate over the silicon dioxide layer.

12. The method of claim 11 wherein the patterned photoresist layer is formed against the silicon nitride layer, wherein the patterned photoresist is formed by exposing a photoresist material to light, and wherein the silicon nitride layer is utilized as an antireflective material during the exposure of the photoresist material to light.

13. A method of forming a semiconductor assembly, comprising:

forming a first material layer over a substrate;

forming a silicon nitride layer over the first material layer, the forming the silicon nitride layer comprising forming a first portion and subsequently forming a second portion in contact with the first portion, the first portion having a lower stoichiometric amount of silicon than the second portion, the second portion comprising an atomic ratio of silicon to nitrogen of at least 1.75; the first portion and second portion being formed by flowing $SiH_2Cl_2$ and $NH_3$ into a reaction chamber, with the ratio of the $SiH_2Cl_2$ to the $NH_3$ being about 0.33 during the formation of the first portion, and being greater than 6 during the formation of the second portion;

forming a photoresist layer over the silicon nitride layer;

patterning the photoresist layer, the patterning comprising exposing portions of the layer of photoresist to light and utilizing the silicon nitride layer as an antireflective material during the exposing; and transferring a pattern from the patterned photoresist layer to the silicon nitride layer and the silicon-containing layer to form a floating gate stack.

14. The method of claim 13 the first material layer comprises at least one of polycrystalline silicon and amorphous silicon.

15. The method of claim 1 wherein the upper portion of the silicon nitride layer comprises an atomic ratio of silicon to nitrogen of 7:4.

16. The method of claim 1 wherein the upper portion of the silicon nitride layer comprises an atomic ratio of silicon to nitrogen of 10:1.

17. The method of claim 7 wherein the second portion of the silicon nitride layer comprises an atomic ratio of silicon to nitrogen of 7:4.

18. The method of claim 7 wherein the second portion of the silicon nitride layer comprises an atomic ratio of silicon to nitrogen of 10:1.

19. The method of claim 13 wherein the second portion of the silicon nitride layer comprises an atomic ratio of silicon to nitrogen of 7:4.

20. The method of claim 13 wherein the second portion of the silicon nitride layer comprises an atomic ratio of silicon to nitrogen of 10:1.

* * * * *

UNITED STATES PATENT AND TRADEMARK OFFICE
CERTIFICATE OF CORRECTION

PATENT NO. : 6,635,530 B2
DATED : October 21, 2003
INVENTOR(S) : Mark A. Helm

It is certified that error appears in the above-identified patent and that said Letters Patent is hereby corrected as shown below:

<u>Title page,</u>
Item [56], References Cited, U.S. PATENT DOCUMENTS, insert
-- 6,143,662   11/2000  Rhodes et al. ………...438/690;
 6,420,777 B2  7/2002  Lam et al. …………..257/650 --; and
FOREIGN PATENT DOCUMENTS, replace "JP   36237854   6/1987" with -- JP 362137854   6/1987 --

Signed and Sealed this

Twentieth Day of July, 2004

JON W. DUDAS
*Acting Director of the United States Patent and Trademark Office*